(12) United States Patent
An et al.

(10) Patent No.: US 11,490,536 B1
(45) Date of Patent: Nov. 1, 2022

(54) ELEVATOR MECHANISM ENABLING FRONT SERVICE OF ELECTRONIC CHASSIS COMPONENTS

(71) Applicant: ZT Group Int'l, Inc., Secaucus, NJ (US)

(72) Inventors: Chen An, Secaucus, NJ (US); Mahesh Kumar Varrey, Secaucus, NJ (US); Son Hung Lam, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 16 days.

(21) Appl. No.: 17/098,811

(22) Filed: Nov. 16, 2020

(51) Int. Cl.
*H05K 5/00* (2006.01)
*H05K 7/14* (2006.01)
*G06F 1/18* (2006.01)

(52) U.S. Cl.
CPC ........... *H05K 7/1402* (2013.01); *G06F 1/185* (2013.01); *G06F 1/186* (2013.01); *H05K 7/1418* (2013.01)

(58) Field of Classification Search
USPC ........ 361/752, 727, 728, 756, 807, 809, 810
See application file for complete search history.

(56) References Cited

U.S. PATENT DOCUMENTS

| | | | | |
|---|---|---|---|---|
| 7,663,889 B2 * | 2/2010 | Lajara | ..................... | G06F 1/185 361/759 |
| 7,684,210 B2 * | 3/2010 | Kosugi | ................ | H05K 7/1409 361/801 |
| 10,863,644 B1 * | 12/2020 | Tseng | ................... | H05K 7/1487 |
| 2008/0123274 A1 * | 5/2008 | Desrosiers | ........... | H05K 7/1402 361/741 |

* cited by examiner

*Primary Examiner* — Hung S. Bui
(74) *Attorney, Agent, or Firm* — Dergosits & Noah LLP; Todd A. Noah

(57) ABSTRACT

An elevator provides for lifting and disconnecting an electronic device from a chassis circuit board and the subsequent removal of the device from a chassis slot. A sliding element between the device and the slot includes tracks within which travel followers associated with the electronic device. Motion in a first direction causes the tracks to move with respect to the followers, raising the device away from the circuit board. In a fully raised position, the device is disconnected and may be removed from the slot. Motion in the opposite direction causes the relative motion between the track and follower to lower the device toward the circuit board. In a fully seated position, the device is connected to the circuit board.

14 Claims, 8 Drawing Sheets

ELEVATOR MECHANISM ENABLING FRONT SERVICE OF ELECTRONIC CHASSIS COMPONENTS

BACKGROUND

An expansion chassis may be provided with a considerable number of slots, each slot populated with an electronic device, such as a PCIe-compatible device. Typically, the service of an individual device requires the complete removal of the chassis, or of a nested tray within the chassis, to access the individual device. As a result, the effort needed to service a single device is multiplied. In addition, the connections associated with other devices may be needlessly disturbed, which may lead to increased times between failures.

Thus, what is needed is an apparatus that provides for the disconnection and removal of a single device from a chassis without disturbing the surrounding devices.

BRIEF DESCRIPTION OF THE DRAWINGS

The embodiments are illustrated by way of example and not limitation in the accompanying drawings, in which like references indicate similar elements, and in which.

DETAILED DESCRIPTION

In embodiments, an apparatus provides for the disconnection and removal of a single device from a chassis without disturbing the surrounding devices. Generally, the embodiments provide for: 1) disconnecting the electronic device by elevating the device with respect to the PCB connector; 2) extracting and replacing the electronic device; and 3) reconnecting the electronic device by causing it to descend and reconnect to the PCB connector, all without requiring that any surrounding devices be disturbed.

In an embodiment, an inner housing or "elevator" is constrained to move vertically within an outer housing. The vertical movement is caused by a horizontal sliding piece situated between the inner (elevator) and outer (cage) housings. The sliding piece includes a track. Followers disposed on the inner housing follow the track, which causes the inner housing to raise or lower as the followers move along the track, depending on the direction of movement forward or rearward. With the inner housing constrained to move vertically with respect to the outer housing, the horizontal motion of the sliding piece is converted into vertical motion of the inner housing. In the raised position, with the electronic device disconnected, the inner housing may be removed from the outer housing. The electronic device may then be removed from the inner housing and serviced or replaced. In the embodiment, the horizontal slider is actuated by a handle rotating about a pin with respect to the outer cage. The rotary motion of the handle out and down is converted to forward motion of the slider, which causes the inner housing to be raised. Conversely, rotating the handle rearward is converted to rearward motion of the slider, which causes both the inner housing to be lowered and the connection established. In an embodiment, the travel may be 9 mm, which in the embodiment is sufficient to engage or disengage a PCIe connecter from an associated connector on a PCB.

In an embodiment, the inner housing may accommodate a carrier dimensioned to hold a PCIe device. In the embodiment, the carrier may be constrained to slide horizontally with respect to the inner housing such that the carrier may be removed from or inserted into the inner housing when the inner housing is raised (in an "eject position"), at which point a connector associated with an electronic device would be in a raised and disconnected position. In embodiments, the inner housing, outer housing, carrier, and slider may be constructed of sheet metal, or other appropriate material.

Figure 1:
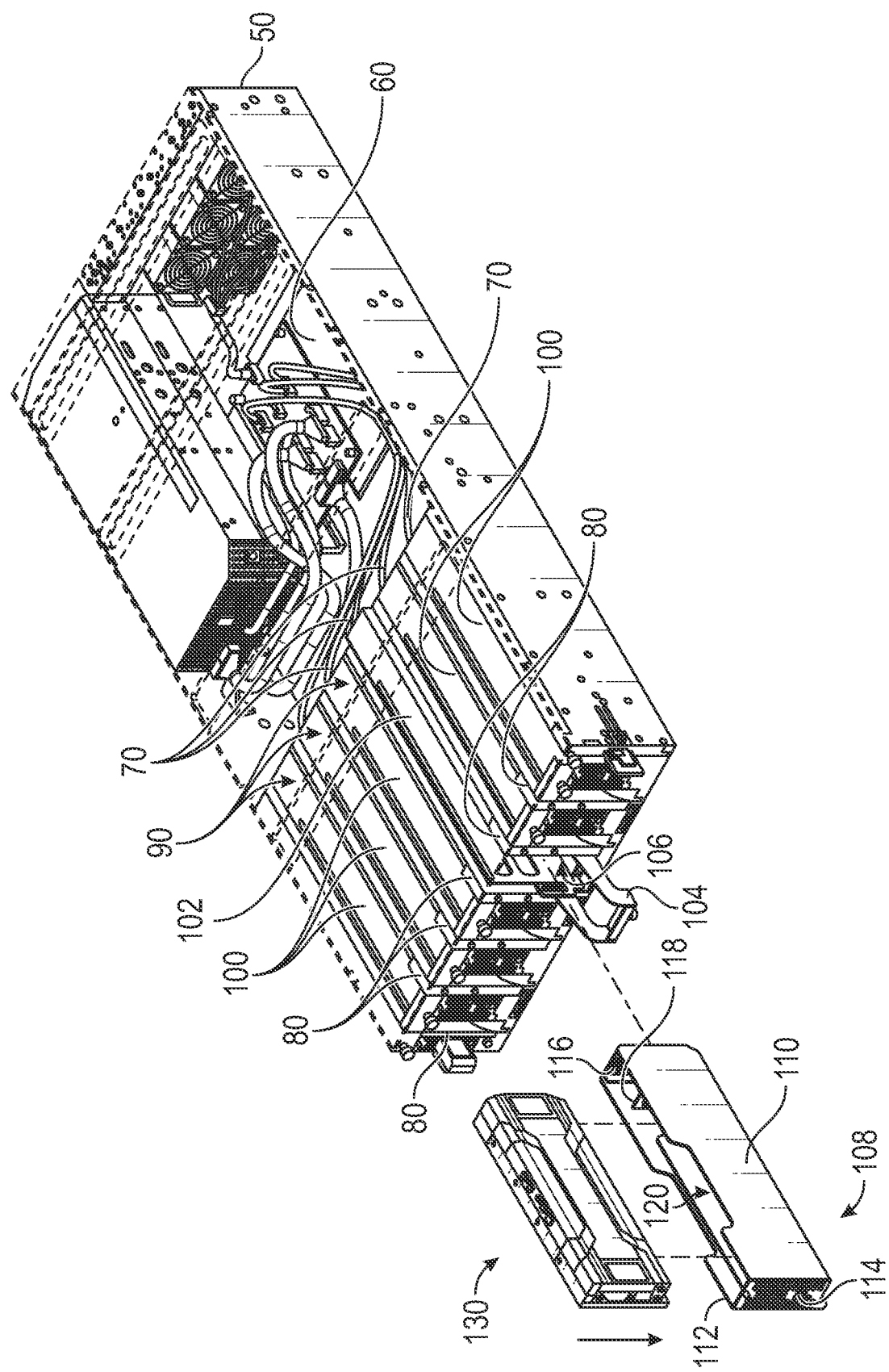
FIG. 1 is a perspective view illustrating an embodiment of an apparatus for facilitating the service of an electronic device.

FIG. 1 is a perspective view illustrating an embodiment of an elevator mechanism 100 for facilitating the service of an electronic device 130. In FIG. 1, elevator mechanisms 100 are shown inserted into chassis positions or slots 90, defined by partitions 80, within a chassis 50. In the exemplary use case, chassis 50 is an expansion chassis and electronic device 130 is a GPU with a PCIe-compatible connection. Each elevator mechanism 100 includes an elevator housing 102 with an associated handle 104 and a front entry port 106. Chassis 50 includes a base board 60, e.g., a PCB, with two sets of connectors to electronic devices 130. A first set of connectors are power connectors 70, which terminate at the rear of each slot 90 and connect to outer connectors 206 (FIG. 2B) on the rear of carrier 108. A second set of connectors are connectors 502 (FIG. 5), which may be provided directly on PCB 60 at the base of each slot 90 (see FIG. 5A-6D). Carrier 108 includes perforated sections 114, 116, 118 that allow for air flow, e.g., for cooling of electronic device 130. In an embodiment, perforated section 118 may be moved within slot 120 to accommodate electronic devices 130 of different lengths.

Figure 5A:
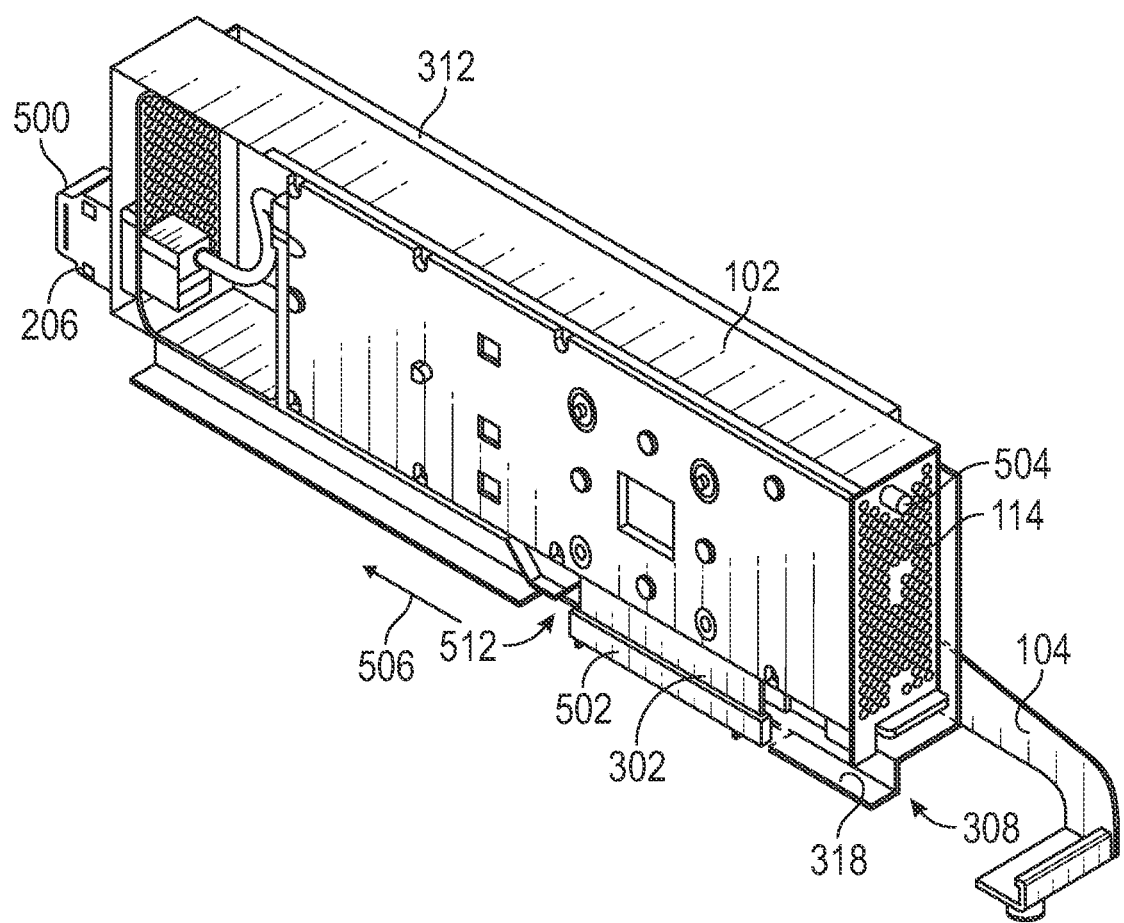
FIG. 5A is a front left, partially transparent perspective view illustrating the embodiment of an apparatus for facilitating the service of an electronic device.

To populate elevator housing 102, electronic device 130 is inserted into a slot 120 between sides 110, 112 of a carrier 108. A power connection is made between electronic device 130 and an outer connector 206 (FIG. 2B) of carrier 108. The populated carrier 108 is then inserted into front entry port 106 until outer connector 206 is connected at the rear of slot 90 to a chassis connector 500 (FIG. 5A). The connection is made blindly, since both connectors are obscured. Handle 104 is then closed, i.e., rotated upward and in. As will be described further, the closing of handle 104 actuates the elevator mechanism that lowers elevator housing 102 (with carrier 108 and electronic device 130), with respect to partition 80 and PCB 60, and causes a connector 302 (FIG. 3) to engage with a connector 502 (FIG. 5) of PCB 60. The removal of electronic device 130 is the reverse of the connection process. Thus, in the insertion and removal of a single electronic device 130, none of the surrounding electronic devices are disturbed.

Figure 2A:
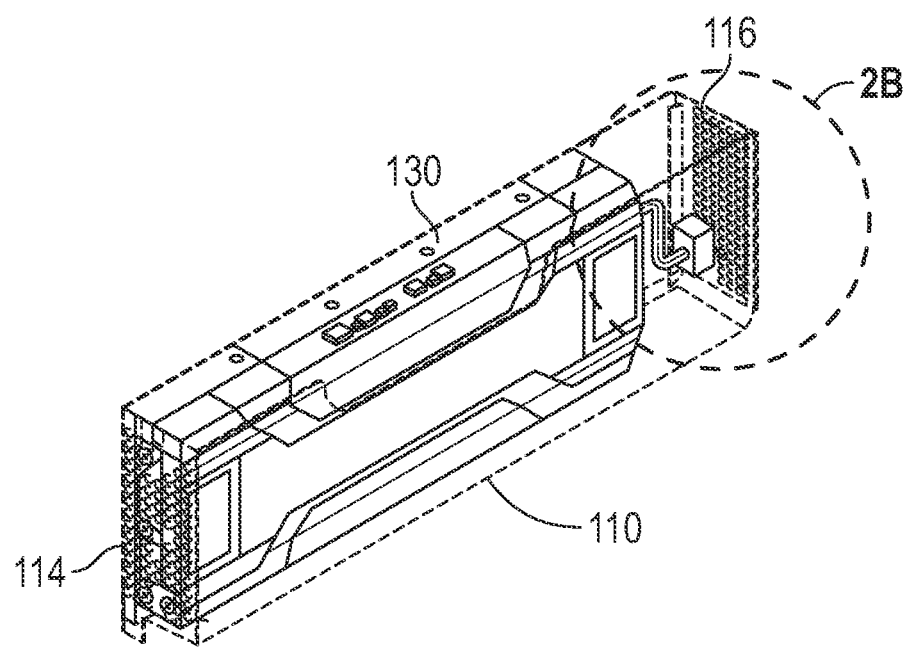
FIG. 2A is a front right perspective view illustrating aspects of the embodiment of an apparatus for facilitating the service of an electronic device.

FIG. 2A is a front right perspective view illustrating carrier 108 populated with electronic device 130. In FIG. 2A, side 110 is rendered partially transparent to show the connection between electronic device 130 and carrier 108.

Figure 2B:
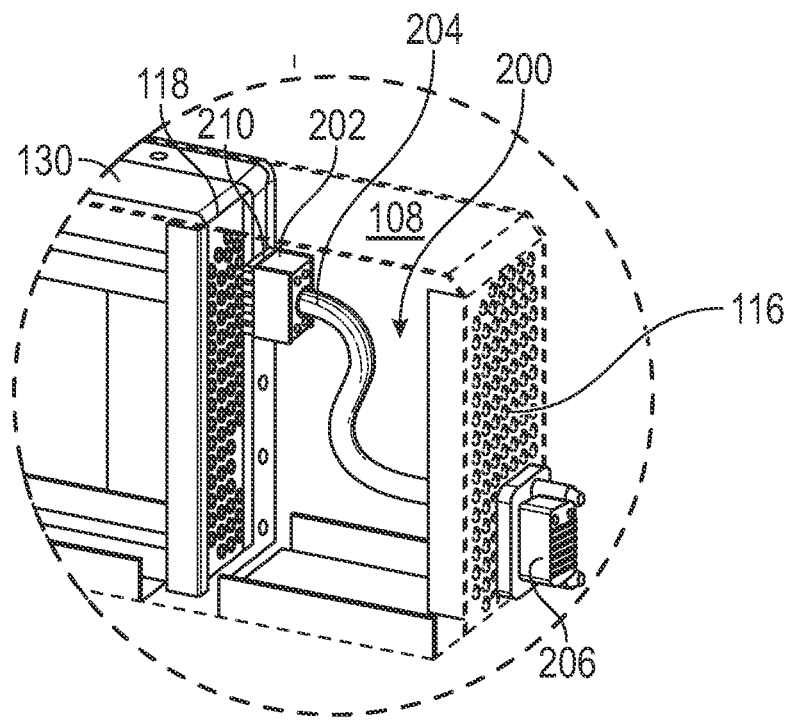
FIG. 2B is a rear perspective view illustrating the indicated section of FIG. 2A.

FIG. 2B is a rear perspective view illustrating the indicated section of FIG. 2A. In FIG. 2B, carrier 108 is shown to have a power connection 200 that includes an inner connector 202, wiring 204, and outer connector 206. Inner connector 202 is configured to connect to a connector 210 of electronic device 130. In embodiments, inner connector 202 and perforated section 119 may be modified to accommodate different sized devices and connectors. Thus, in embodiments, the different elevator mechanisms 100 may be populated with different types of devices, e.g., different types of PCIe devices, such as GPUs, hard drives, SSDs, Wi-Fi, and Ethernet devices.

Figure 3:
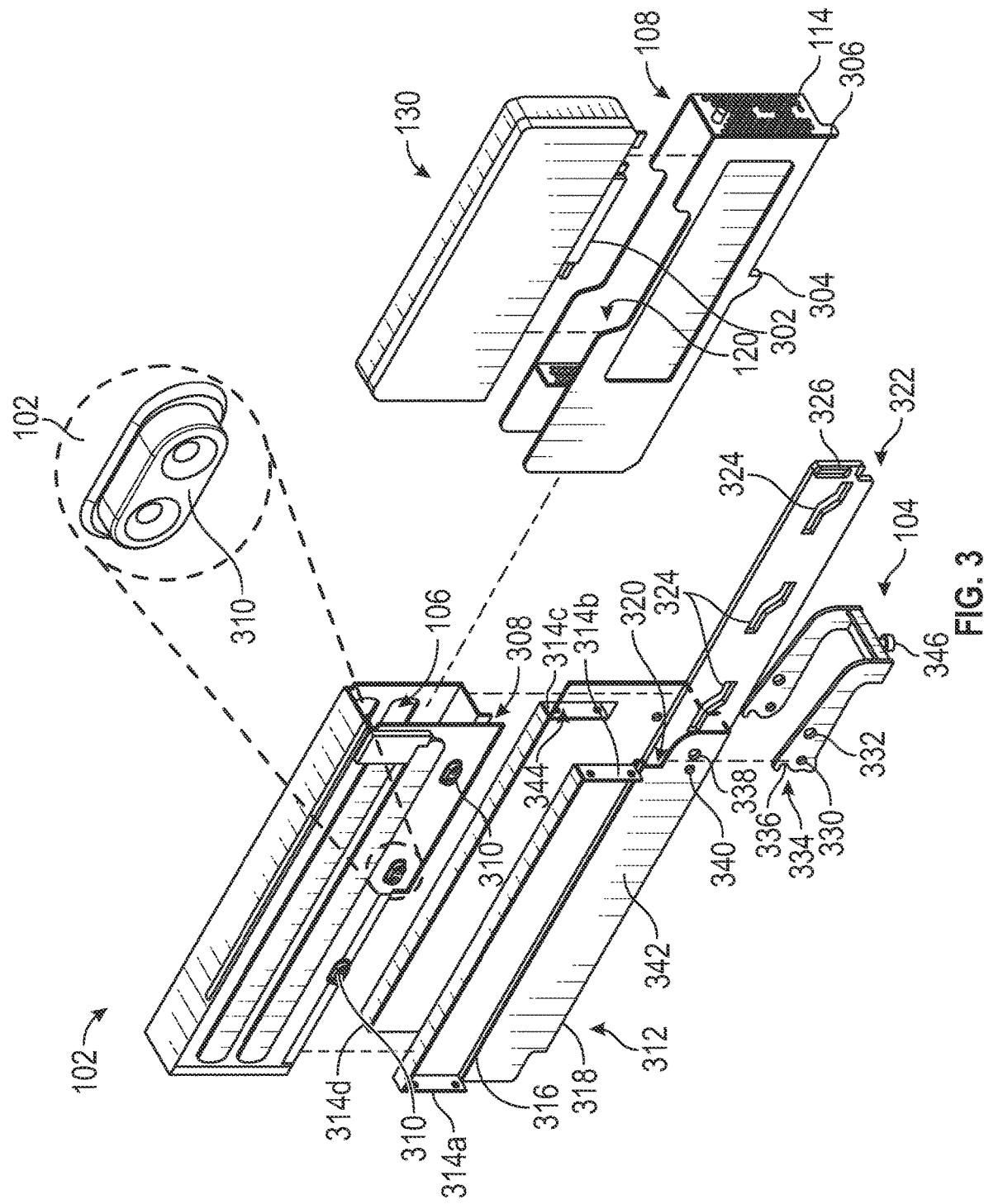
FIG. 3 is an assembly view of the embodiment of an apparatus for facilitating the service of an electronic device.

FIG. 3 is an assembly view of the embodiment of elevator mechanism 100. In FIG. 3, mechanism 100 is shown to include carrier 108, elevator housing 102, an outer housing 312, and an actuator (or "slider") 322. Electronic device 130 is shown to include connector 302. Electronic device 130 is an exemplary GPU with a PCIe connection. In embodiments, the type of connection may be changed to another type of connection that may be mated using the elevator mechanism. When device 130 is inserted into slot 120 of carrier 108, connector 302 protrudes from the base of carrier 108 between tabs 304, 306. In embodiments, tabs 304, 306 may serve to protect connector 302 on insertion or removal, and may serve as travel limiters when elevator housing 102 is lowered onto PCB 60. Connector 302 may be a "gold finger" connection.

When carrier 108 is populated and inserted into entry port 106, tab 304 and connector 302 slide within a connector slot 308 of elevator housing 102. Connector slot 308 is open from the bottom to allow connector 302 and connector 502 to mate. Elevator housing 102 further includes protrusions (or "followers") 310 on one side.

Outer housing 312 is shown to include flanges 314a . . . 314d, a lip 316, a base 318, a recess 320, a pin 338, a handle travel limit pin 340, an outer side section 342, and a window 344. Flanges 314a . . . 314d are configured to receive partitions 80 of chassis 50 and maintain outer housing 312 is the proper fore/aft position within slot 90. Recess 320 is dimensioned to receive slider 322 and is formed between lip 316, outer side section 342 and base 318. Recess 320 constrains slider 322 to fore/aft motion. Handle 104 pivots about pin 338, with the extent of the pivot being limiting by pin 340. Window 344 receives a raised section 402 (FIG. 4) of elevator housing 102. The interaction between the edges of window 344 and edges of raised section 402 constrains elevator housing 102 to linear motion with respect to outer housing 312 (which is vertical linear motion in the several views).

Slider 322 includes tracks 324 and an actuator track 326. In the embodiment, tracks 324 are slots within slider 322. Tracks 324 are further from base 318 at one end and nearer to base 318 at the other. When assembled, each follower 310 of elevator housing 102 travels within a slot 324. Raised section 402 travels within window 344. When assembled, with elevator housing 102 constrained to vertical motion by raised section 402 and window 344, movement of slider 322 rearward (to the left as shown) causes followers 310 to move within tracks 324 to the track section nearer base 318. Thus, rearward motion of slider 322 causes elevator housing 102 to be lowered toward PCB 60. Conversely, forward movement of slider 322 causes followers 310 to move within tracks 324 to the track section further from base 318. Thus, forward motion of slider 322 causes elevator housing 102 to be raised away from PCB 60. Thus, connector 302 may be mated to or disconnected from connector 502 by the fore/aft movement of slider 322. In an embodiment, the relative change in height caused by followers 310 traveling within tracks 324 may be 9 mm, an amount of travel determined sufficient to engage and disengage connectors 302, 502.

Handle 104 includes a pivot hole 330, a pin 332, a cam track 334, a cam track stop 336, and a thumb screw 346. Pivot hole 330 engages pin 338 and handle 104 rotates about pin 338. The rotation is limited by limiter pin 340 traveling within the bounds of cam track 334. When assembled, pin 332 is disposed within actuator track 326 such that rotation of handle 104 causes pin 322 to travel within actuator track 326. With handle 104 pivoting about pin 338, the rotational motion of handle 104 and the movement of pin 332 within track 326, and the constraint of slider 322 within recess 320, cause linear fore/aft motion of slider 322.

Figure 4A:
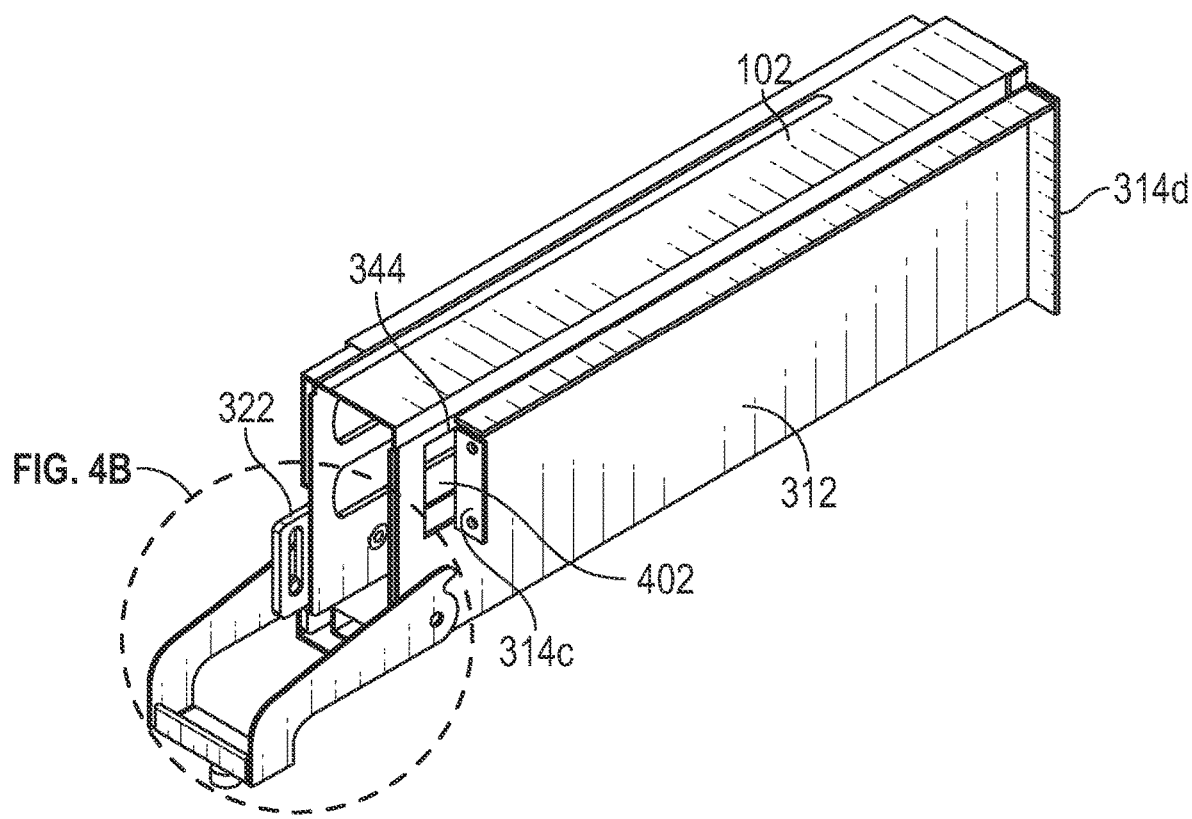
FIG. 4A is a front right perspective view illustrating the embodiment of an apparatus for facilitating the service of an electronic device.

FIG. 4A is a front right perspective view illustrating elevator mechanism 100 with elevator housing 102, handle 104, outer housing 312, and slider 322, assembled. In FIG. 4A, outer housing 312 is shown to include window 344, with raised section 402 of elevator housing 102 being received by window 344. Thus, elevator housing 102 is constrained to move vertically with respect to outer housing 312.

Figure 4B:
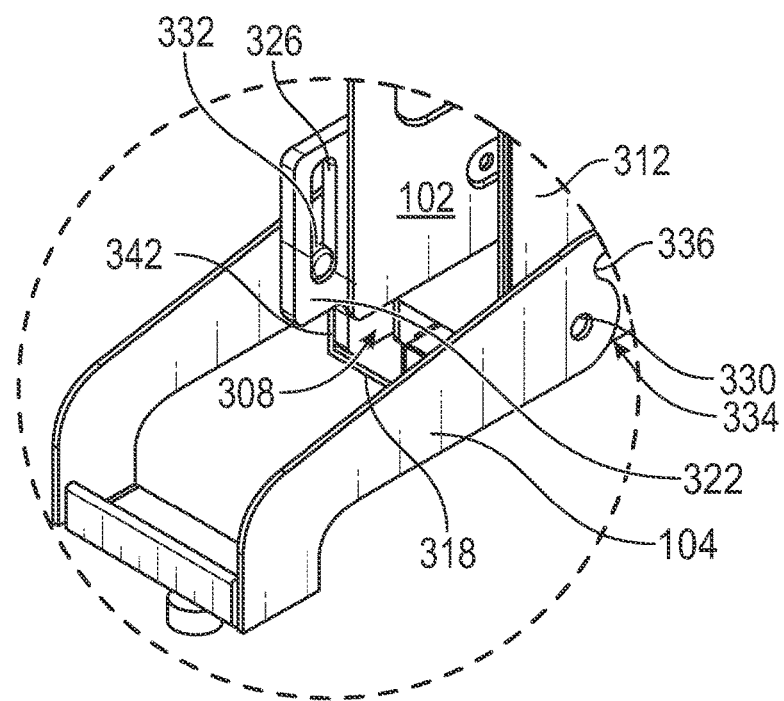
FIG. 4B further illustrates the indicated section of FIG. 4A.

FIG. 4B further illustrates the indicated section of FIG. 4A. In FIG. 4B, pin 322 of handle 104 is shown to travel within actuator track 326, causing slider 322 to move fore/aft with respect to both elevator housing 102 and outer housing 312. FIG. 4B further illustrates connector window 308 within elevator housing 102. A window 512 (FIG. 5A) within base 318 of outer housing 312 allows connector 502 (FIG. 5A) to pass through outer housing 312 and mate with connector 302.

FIG. 5A is a front left, partially transparent perspective view illustrating elevator mechanism 100. In FIG. 5A, chassis-side power connector 500 is shown connected to outer connector 206. To be connected in this manner, populated carrier 108 was inserted in direction 506 into elevator housing 102, forcing connector 206 through a window at the rear of housing 102 and into connector 500. FIG. 5A further illustrates the relationship between device connector 302 and board connector 502, which is extended upward through window 512 of base 318. As shown, with handle 104 open (rotated forward), elevator housing 102 is raised and connector 302 is not mated with connector 502.

Figure 5B:
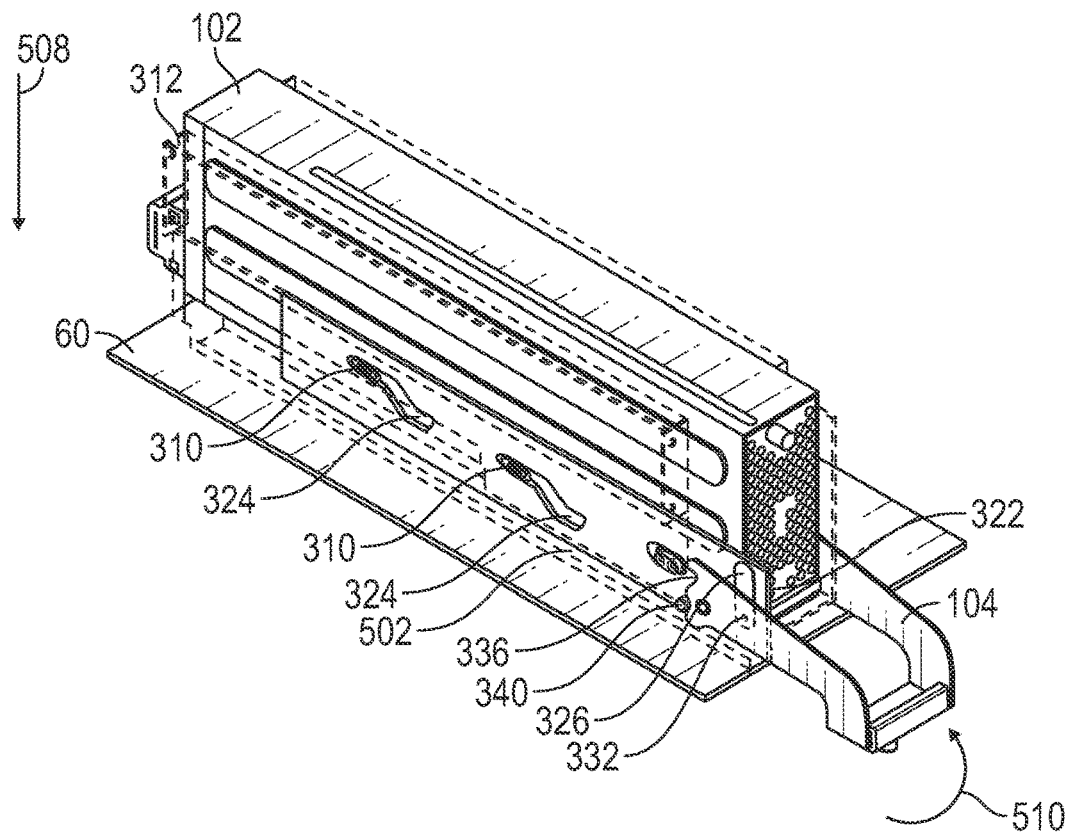
FIG. 5B is a front left, partially transparent perspective view illustrating the embodiment of an apparatus for facilitating the service of an electronic device.

FIG. 5B is a front left, partially transparent perspective view illustrating elevator mechanism 100. In FIG. 5B, handle 104 is open, and followers 310 are positioned in the upward sections of tracks 324, i.e., elevator housing 102 is raised with respect to outer housing 312. In FIG. 5B, connector 502 remains partly visible, indicating (along with the position of handle 104) that elevator housing 102 is not lowered and that connectors 302 and 502 are not connected.

Figure 5C:
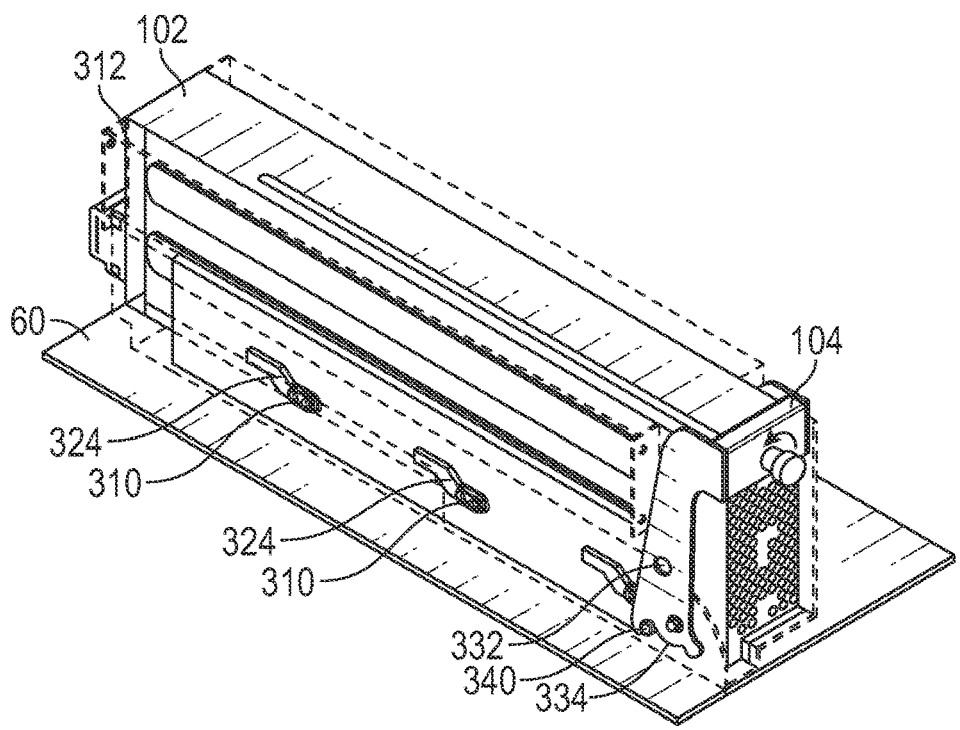
FIG. 5C is a front left, partially transparent perspective view illustrating the embodiment of an apparatus for facilitating the service of an electronic device.

FIG. 5C is a front left, partially transparent perspective view illustrating elevator mechanism 100. From the position of FIG. 5B, the completely lowered position of FIG. 5C is attained by rearward rotation 510 of handle 104 to the closed position. That rearward rotation pushes slider 322 (FIG. 3) rearward and causes tracks 324 to move rearward. Followers 310, in following tracks 324, move from the elevated sections of tracks 324 (as shown in FIG. 5B) to the lower sections of tracks 324 (as shown in FIG. 5C). The downward movement of followers 310 in turn lowers elevator housing 102 straight down 508 toward base board 60. This causes connector 302 to be inserted into connector 502. The travel of handle 104 is limited by limited pin 340 within cam track 336. Handle 104 may be retained in the upward, closed position by thumbscrew 346 engaging socket 504.

Figure 6A:
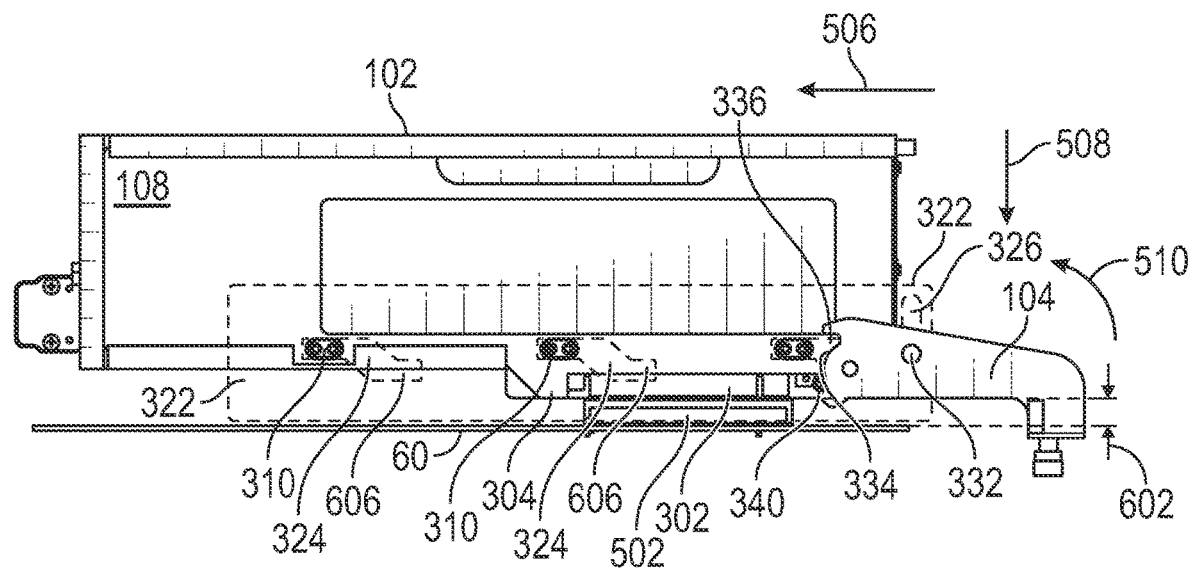
FIG. 6A is a left side, partially transparent view illustrating the embodiment of an apparatus for facilitating the service of an electronic device.
Figure 6B:
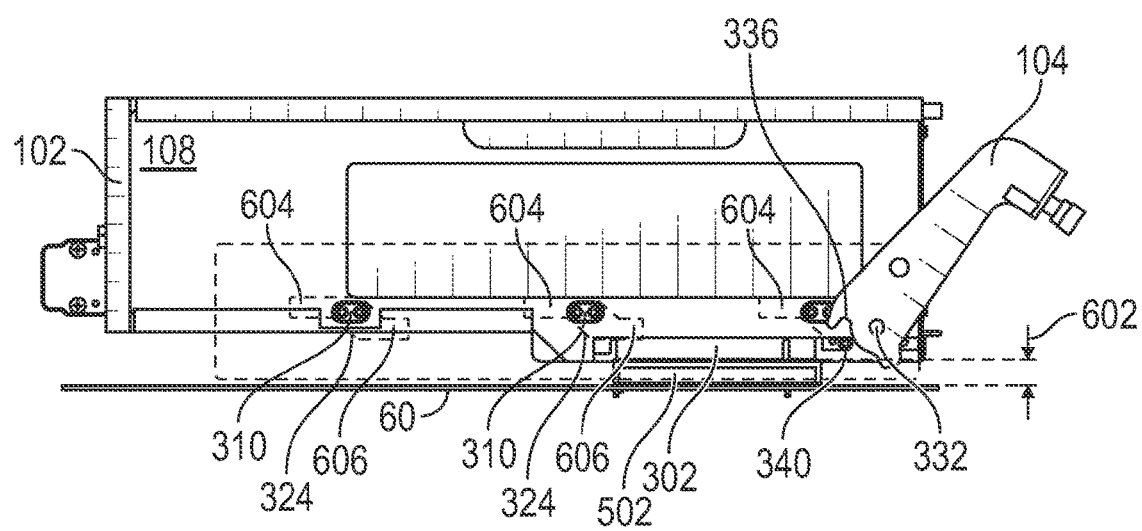
FIG. 6B is a left side, partially transparent view illustrating the embodiment of an apparatus for facilitating the service of an electronic device.

FIG. 6A is a left side, partially transparent view illustrating elevator mechanism 100. In FIG. 6A, handle 104 is in the open position and slider 322 is in the forward position with pin 332 within actuator track 326. Slider 322 is forward with respect to both elevator housing 102 and outer housing 312. Followers 310 within tracks 324 are positioned in elevated sections 604 (FIG. 6B). Connector 302 is shown disconnected at a distance 602 from PCB 60. In this position, when carrier 108 is drawn forward (the reverse of direction 506), connector 302 will not be hindered and carrier 108 may be completely removed from elevator housing 102. In an embodiment, the travel 602 between raised sections 604 and lowered sections 606 is 9 mm, which is determined sufficient to engage and disengage connectors 302 and 502.

FIG. 6B is a left side, partially transparent illustrating elevator mechanism 100. In FIG. 6B, handle 104 has been partially rotated closed. The rotation has pushed slider 322 rearward 506 relative to connector 502, elevator housing 102, and followers 310. The motion of slider 322 has moved tracks 324 rearward 506 so that followers 310 are positioned between elevated sections 604 and lowered sections 606. The motion of followers 310 within tracks 324 has caused a right, upper edge of follower 310 to contact a slanted, upper section of track 324. That contact and subsequent relative motion between track 324 and follower 310 has pushed follower 310 down 508 slightly, which in turn has pulled elevator housing 102 down slightly as well.

Figure 6C:
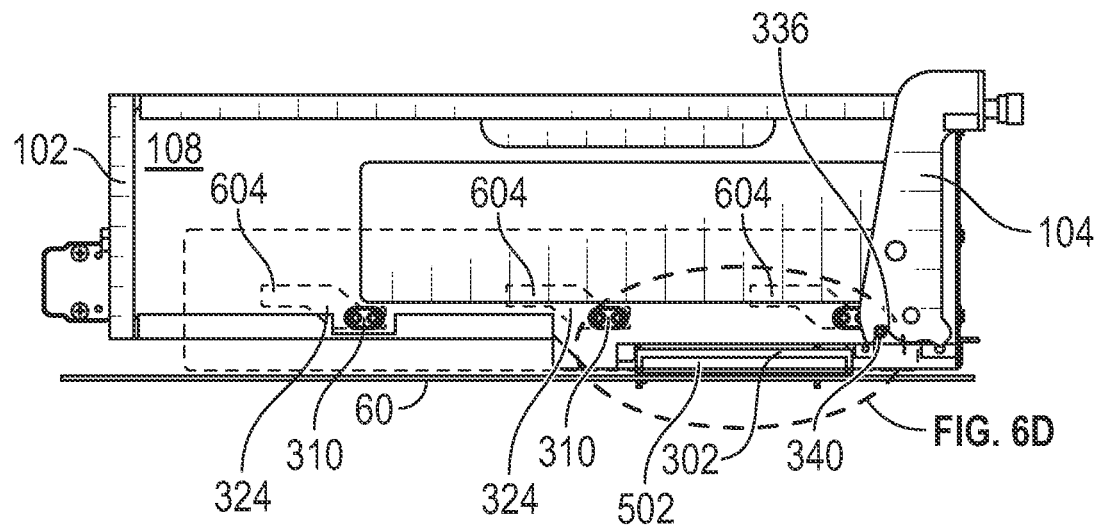
FIG. 6C is a left side, partially transparent view illustrating the embodiment of an apparatus for facilitating the service of an electronic device.

FIG. 6C is a left side, partially transparent view illustrating elevator mechanism 100. In FIG. 6C, handle 104 has been completely closed, as indicated by limiter pin 340 being positioned at track stop 336. The completed rotation has pushed slider 322 fully rearward 506, moving tracks 324 rearward 506 so that followers 310 are positioned at lowered sections 606. The motion of followers 310 within tracks 324 has caused followers 310 to travel from upper section 604 to lowered sections 606, which in turn has pulled elevator housing 102 fully down 508 and connector 302 to mate with connector 502.

Figure 6D:
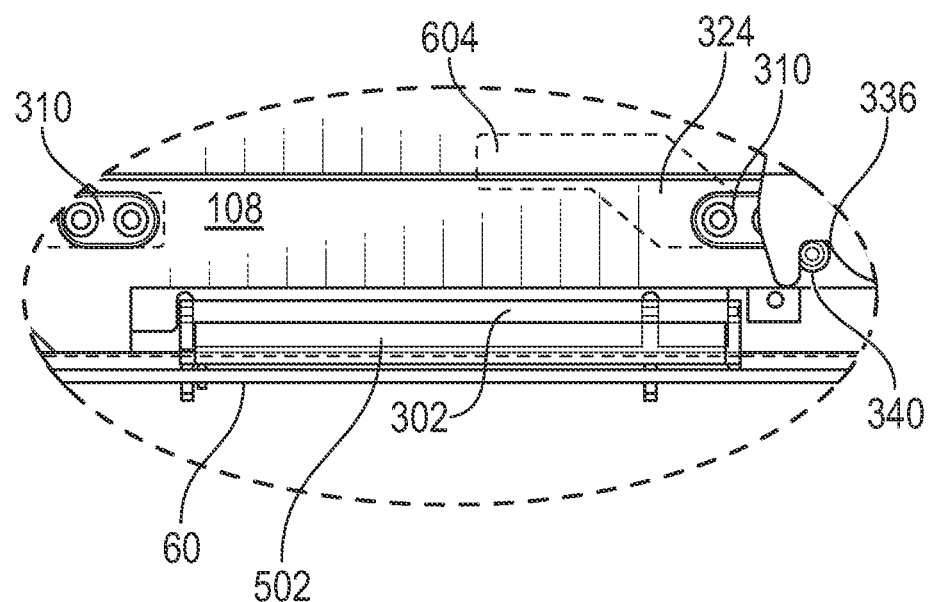
FIG. 6D is a left side, partially transparent view of the section indicated in FIG. 6C.

FIG. 6D is a left side, partially transparent view of the section indicated in FIG. 6C. In FIG. 6D, connector 302 of electronic device 130 is shown fully connected to connector 502 of base board 60.

In an embodiment, the elements of housing 312 may be incorporated directly into the sides of a slot of an expansion chassis, such that handle 104 pivots about a section of the chassis slot and slider 322 moves with respect to the slot. In an embodiment, the relative positions of followers 310 and tracks 324 may be reversed. That is, followers 310 may be provided on slider 322 and tracks 324 may be provided in elevator housing 102. In an embodiment, track 324 may be a raised track with followers 310 configured to travel along a raised track, e.g., follower 310 may be "U"-shaped with raised track 324 fitting within the "U." In an embodiment, slider 322 may be associated with elevator housing 102 such that slider 322 travels up and down with the motion of elevator housing 102 with respect to outer housing 318. That is embodiments are not limited to the illustrated configuration of slider, track, and follower. In an embodiment, the actuator/slider may be associated with the elevator housing, with the horizontal movement of the actuator causing both the elevator housing and the actuator to rise/drop. In an embodiment, the actuation of slider 322 provided by the rotation of handle 104 may be provided by other means, e.g., by a lever. In an embodiment, followers 310 may follow vertical tracks and the rotation of handle 104 may be transmitted by cords attached to each follower 310, upper cords drawing the follower upward or downward cords drawing the follower downward according to the handle rotation. In an embodiment, the actuation of slider 322 may be performed manually by the user. In an embodiment, a spring may bias elevator 102 to the raised, disconnected position. In an embodiment, a spring may bias elevator 102 to the lowered, connected position.

The following includes enumerated embodiments.

Embodiment 1 is an apparatus comprising: a slot including a first side and a second side, the first side extending from a base; an inner housing received between the first side and the second side and dimensioned to receive an electronic device; an actuator provided between the inner housing and the first side and moveable with respect to the inner housing and the first side between a first actuator position and a second actuator position; a first track including a first track position and a second track position, the first track position being further from the base than a second track position; and a first track follower engaging the first track and movable along the first track between the first track position and the second track position, wherein: the first track is associated with one of the actuator or the inner housing and the first track follower is associated with the other of the actuator or the inner housing; with the actuator in the first actuator position, the first track follower is positioned at the first track position; and movement of the actuator from the first actuator position to the second actuator position causes the first track follower to move along the first track to the second track position and the inner housing to move linearly a first distance toward the base.

Embodiment 2 includes the apparatus of embodiment 1, wherein the inner housing includes a first window dimensioned to admit a first connector, and wherein, when the inner housing is populated with the electronic device, movement of the inner housing the first distance toward the base is sufficient to connect the electronic device to the first connector.

Embodiment 3 includes the apparatus of embodiment 2, further including an outer housing that includes the slot, the first side, the second side, and the base, the base being provided with a second window dimensioned to admit the first connector.

Embodiment 4 includes the apparatus of embodiment 1, wherein the first side or the second side includes a third window oriented perpendicularly to the base and the inner housing includes a raised section configured to move within the second window such that relative movement between the inner housing and the second window is constrained to movement of the inner housing toward or from the base.

Embodiment 5 includes the apparatus of embodiment 1: wherein the actuator includes a flat member configured to slide between the first side and the inner housing; wherein the first track includes a first slot disposed in the actuator, the first slot including the first track position and second track position; wherein the first track follower includes a first protrusion from the inner housing; and wherein the with the actuator in the first actuator position, the first track follower is at the first track position; and movement of the actuator from the first actuator position to the second actuator position causes the first track follower to move along the first track to the second track position and the inner housing to move a first distance linearly toward the base, includes: with the actuator in the first actuator position, the first protrusion is at the first track position and the inner housing is at the first distance from the base; and movement of the actuator from the first actuator position to the second actuator position causes the first protrusion to move along the first slot to the second track position and the inner housing to move the first distance linearly toward the base.

Embodiment 6 includes the apparatus of embodiment 5 further including: a second slot disposed in the actuator and including a third track position and a fourth track position; and a second protrusion from the inner housing and dimensioned to move along the second slot between the third track position and the fourth track position, wherein: with the actuator in the first actuator position, the second protrusion is at the third track position and the inner housing is at the first distance from the base; and movement of the actuator from the first actuator position to the second actuator position causes the second protrusion to move along the second slot to the fourth track position and the inner housing to move the first distance linearly toward the base.

Embodiment 7 includes the apparatus of embodiment 1: wherein the actuator includes a flat member configured to slide between the first side and the inner housing; wherein the first track includes a third slot disposed in the inner housing, the third slot including the first track position and second track position; wherein the first track follower includes a third protrusion from the actuator; and wherein the with the actuator in the first actuator position, the first track follower is at the first track position; and movement of the actuator from the first actuator position to the second actuator position causes the first track follower to move along the first track to the second track position and the inner housing to move the first distance linearly toward the base, includes: with the actuator in the first actuator position, the third protrusion is at the first track position and the inner housing is at the first distance from the base; and movement of the actuator from the first actuator position to the second actuator position causes the third protrusion to move along the third slot to the second track position and the inner housing to move the first distance linearly toward the base.

Embodiment 8 includes the apparatus of embodiment 7 further including: a fourth slot disposed in the actuator and including a fifth track position and a sixth track position; and a fourth protrusion from the inner housing and dimensioned to move along the fourth slot between the fifth track position and the sixth track position, wherein: with the actuator in the first actuator position, the fourth protrusion is at the fifth track position and the inner housing is at the first distance from the base; and movement of the actuator from the first actuator position to the second actuator position causes the fourth protrusion to move along the fourth slot to the sixth track position and the inner housing to move the first distance linearly toward the base.

Embodiment 9 includes the apparatus of embodiment 1 further including a lever attached to the first side, pivotable about an axis, and including an extension in a direction of the axis, wherein: the extension is received by a fifth slot disposed in the actuator and oriented such that rotation of the lever causes the actuator to move linearly between the first actuator position and the second actuator position.

Embodiment 10 includes the apparatus of embodiment 1 further including a carrier: dimensioned to receive an electronic device; dimensioned to be received within the inner housing; and including a second connector for connecting the electronic device to a chassis.

Embodiment 11 includes the apparatus of embodiment 1, wherein actuator movement relative the first side is constrained to movement that is parallel to the base.

Embodiment 12 includes the apparatus of embodiment 1, wherein actuator movement relative to the inner housing is constrained to movement that is parallel to the base.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
   an outer housing including a slot having a first side, a second side, and a base, the first side extending from the base, the base being provided with a second window dimensioned to admit a first connector associated with a chassis;
   an inner housing received between the first side and the second side and configured to receive an electronic device, the inner housing including a first window configured to admit the first connector;
   an actuator provided between the inner housing and the first side and moveable with respect to the inner housing and the first side between a first actuator position and a second actuator position;

a first track including a first track position and a second track position, the first track position being further from the base than a second track position; and a first track follower engaging the first track and movable along the first track between the first track position and the second track position, wherein:

the first track is associated with one of the actuator or the inner housing and the first track follower is associated with the other of the actuator or the inner housing;

with the actuator in the first actuator position, the first track follower is positioned at the first track position; and movement of the actuator from the first actuator position to the second actuator position causes the first track follower to move along the first track to the second track position and the inner housing to move linearly a first distance toward the base sufficient to connect the electronic-device to the first connector when the inner housing is populated with the electronic device.

2. The apparatus of claim 1, wherein the first side or the second side includes a third window oriented perpendicularly to the base and the inner housing includes a raised section configured to move within the second window such that relative movement between the inner housing and the second window is constrained to movement of the inner housing toward or from the base.

3. The apparatus of claim 1:
wherein the actuator includes a flat member configured to slide between the first side and the inner housing;
wherein the first track includes a first slot disposed in the actuator, the first slot including the first track position and second track position;
wherein the first track follower includes a first protrusion from the inner housing; and
wherein, with the actuator in the first actuator position, the first track follower is at the first track position, includes, with the actuator in the first actuator position, the first protrusion is at the first track position and the inner housing is at the first distance from the base; and
wherein movement of the actuator from the first actuator position to the second actuator position causes the first track follower to move along the first track to the second track position and the inner housing to move a first distance linearly toward the base, includes movement of the actuator from the first actuator position to the second actuator position causes the first protrusion to move along the first slot to the second track position and the inner housing to move the first distance linearly toward the base.

4. The apparatus of claim 3 further including:
a second slot disposed in the actuator and including a third track position and a fourth track position; and
a second protrusion from the inner housing and configured to move along the second slot between the third track position and the fourth track position, wherein, with the actuator in the first actuator position, the second protrusion is at the third track position and the inner housing is at the first distance from the base; and
movement of the actuator from the first actuator position to the second actuator position causes the second protrusion to move along the second slot to the fourth track position and the inner housing to move the first distance linearly toward the base.

5. The apparatus of claim 1:
wherein the actuator includes a flat member configured to slide between the first side and the inner housing;
wherein the first track includes a third slot disposed in the inner housing, the third slot including the first track position and second track position;
wherein the first track follower includes a third protrusion from the actuator; and
wherein, with the actuator in the first actuator position, the first track follower is at the first track position, includes, with the actuator in the first actuator position, the third protrusion is at the first track position and the inner housing is at the first distance from the base; and
wherein movement of the actuator from the first actuator position to the second actuator position causes the first track follower to move along the first track to the second track position and the inner housing to move the first distance linearly toward the base, includes movement of the actuator from the first actuator position to the second actuator position causes the third protrusion to move along the third slot to the second track position and the inner housing to move the first distance linearly toward the base.

6. The apparatus of claim 5 further including:
a fourth slot disposed in the actuator and including a fifth track position and a sixth track position; and
a fourth protrusion from the inner housing and configured to move along the fourth slot between the fifth track position and the sixth track position, wherein, with the actuator in the first actuator position, the fourth protrusion is at the fifth track position and the inner housing is at the first distance from the base; and
movement of the actuator from the first actuator position to the second actuator position causes the fourth protrusion to move along the fourth slot to the sixth track position and the inner housing to move the first distance linearly toward the base.

7. The apparatus of claim 1 further including a lever attached to the first side, pivotable about an axis, and including an extension in a direction of the axis, wherein the extension is received by a fifth slot disposed in the actuator and oriented such that rotation of the lever causes the actuator to move linearly between the first actuator position and the second actuator position.

8. The apparatus of claim 1 further including a carrier:
configured to receive an electronic device;
configured dimensioned to be received within the inner housing; and
including a second connector for connecting the electronic device to a chassis.

9. The apparatus of claim 1, wherein actuator movement relative the first side is constrained to movement that is parallel to the base.

10. The apparatus of claim 1, wherein actuator movement relative to the inner housing is constrained to movement that is parallel to the base.

11. An apparatus comprising:
a slot including a first side and a second side, the first side extending from a base;
an inner housing received between the first side and the second side and configured to receive an electronic device;
an actuator provided between the inner housing and the first side and moveable with respect to the inner housing and the first side between a first actuator position and a second actuator position;
a first track including a first track position and a second track position, the first track position being further from the base than a second track position; and a first track follower engaging the first track and movable
along the first track between the first track position and
the second track position, wherein:
the first track is associated with one of the actuator or the
inner housing and the first track follower is associated
with the other of the actuator or the inner housing;
with the actuator in the first actuator position, the first
track follower is positioned at the first track position;
movement of the actuator from the first actuator position
to the second actuator position causes the first track
follower to move along the first track to the second
track position and the inner housing to move linearly a
first distance toward the base; and
the first side or the second side includes a third window
oriented perpendicularly to the base and the inner
housing includes a raised section configured to move
within the second window such that relative movement
between the inner housing and the second window is
constrained to movement of the inner housing toward
or from the base.

12. An apparatus comprising:
a slot including a first side and a second side, the first side
extending from a base;
an inner housing received between the first side and the
second side and configured to receive an electronic
device;
an actuator provided between the inner housing and the
first side and moveable with respect to the inner housing and the first side between a first actuator position
and a second actuator position, and including a flat
member configured to slide between the first side and
the inner housing;
a first track including a first track position and a second
track position, the first track position being further from
the base than a second track position, and the first track
including a first slot disposed in the actuator, the first
slot including the first track position and second track
position; and
a first track follower engaging the first track and movable
along the first track between the first track position and
the second track position, and the first track follower
including a first protrusion from the inner housing,
wherein:
the first track is associated with one of the actuator or the
inner housing and the first track follower is associated
with the other of the actuator or the inner housing;
with the actuator in the first actuator position, the first
track follower is positioned at the first track position;
movement of the actuator from the first actuator position
to the second actuator position causes the first track
follower to move along the first track to the second
track position and the inner housing to move linearly a
first distance toward the base;
with the actuator in the first actuator position, the first
track follower is at the first track position, includes,
with the actuator in the first actuator position, the first
protrusion is at the first track position and the inner
housing is at the first distance from the base; and
movement of the actuator from the first actuator position
to the second actuator position causes the first track
follower to move along the first track to the second
track position and the inner housing to move a first
distance linearly toward the base, includes movement
of the actuator from the first actuator position to the
second actuator position causes the first protrusion to
move along the first slot to the second track position
and the inner housing to move the first distance linearly
toward the base.

13. An apparatus comprising:
a slot including a first side and a second side, the first side
extending from a base;
an inner housing received between the first side and the
second side and configured to receive an electronic
device;
an actuator provided between the inner housing and the
first side, and moveable with respect to the inner
housing and the first side between a first actuator
position and a second actuator position, and including
a flat member configured to slide between the first side
and the inner housing;
a first track including a third slot disposed in the inner
housing, the third slot including a first track position
and a second track position, the first track position
being further from the base than a second track position; and
a first track follower engaging the first track and movable
along the first track between the first track position and
the second track position, and including a third protrusion from the actuator, wherein:
the first track is associated with one of the actuator or the
inner housing and the first track follower is associated
with the other of the actuator or the inner housing;
with the actuator in the first actuator position, the first
track follower is positioned at the first track position;
movement of the actuator from the first actuator position
to the second actuator position causes the first track
follower to move along the first track to the second
track position and the inner housing to move linearly a
first distance toward the base;
with the actuator in the first actuator position, the first
track follower is at the first track position, includes,
with the actuator in the first actuator position, the third
protrusion is at the first track position and the inner
housing is at the first distance from the base; and
movement of the actuator from the first actuator position
to the second actuator position causes the first track
follower to move along the first track to the second
track position and the inner housing to move the first
distance linearly toward the base, includes movement
of the actuator from the first actuator position to the
second actuator position causes the third protrusion to
move along the third slot to the second track position
and the inner housing to move the first distance linearly
toward the base.

14. An apparatus comprising:
a slot including a first side and a second side, the first side
extending from a base;
an inner housing received between the first side and the
second side and configured to receive an electronic
device;
an actuator provided between the inner housing and the
first side and moveable with respect to the inner housing and the first side between a first actuator position
and a second actuator position;
a first track including a first track position and a second
track position, the first track position being further from
the base than a second track position;
a first track follower engaging the first track and movable
along the first track between the first track position and
the second track position, and a lever attached to the first side, pivotable about an axis, and including an extension in a direction of the axis, wherein:

the first track is associated with one of the actuator or the inner housing and the first track follower is associated with the other of the actuator or the inner housing;

with the actuator in the first actuator position, the first track follower is positioned at the first track position;

movement of the actuator from the first actuator position to the second actuator position causes the first track follower to move along the first track to the second track position and the inner housing to move linearly a first distance toward the base; and the extension is received by a fifth slot disposed in the actuator and oriented such that rotation of the lever causes the actuator to move linearly between the first actuator position and the second actuator position.

* * * * *